(12) United States Patent
Chou et al.

(10) Patent No.: US 11,476,204 B2
(45) Date of Patent: Oct. 18, 2022

(54) FLIP-CHIP PACKAGING SUBSTRATE AND METHOD FOR FABRICATING THE SAME

(71) Applicant: PHOENIX PIONEER TECHNOLOGY CO., LTD., Hsinchu County (TW)

(72) Inventors: Pao-Hung Chou, Hsinchu County (TW); Chun-Hsien Yu, Hsinchu County (TW); Shih-Ping Hsu, Hsinchu County (TW); Tung-Yao Kuo, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 0 days.

(21) Appl. No.: 16/404,856

(22) Filed: May 7, 2019

(65) Prior Publication Data

US 2019/0348375 A1 Nov. 14, 2019

(30) Foreign Application Priority Data

May 10, 2018 (TW) ................ 107115944

(51) Int. Cl.
| | |
|---|---|
| H01L 23/00 | (2006.01) |
| H01L 23/31 | (2006.01) |
| H01L 23/498 | (2006.01) |
| H01L 21/683 | (2006.01) |
| H01L 21/48 | (2006.01) |
| H01L 21/56 | (2006.01) |

(52) U.S. Cl.
CPC ........ *H01L 23/562* (2013.01); *H01L 21/4853* (2013.01); *H01L 21/4857* (2013.01); *H01L 21/563* (2013.01); *H01L 21/6835* (2013.01); *H01L 23/3157* (2013.01); *H01L 23/49822* (2013.01); *H01L 23/49838* (2013.01); *H01L 24/16* (2013.01); *H01L 2221/68359* (2013.01); *H01L 2224/16227* (2013.01); *H01L 2924/18161* (2013.01); *H01L 2924/3511* (2013.01)

(58) Field of Classification Search
CPC .............. H01L 23/562; H01L 21/4857; H01L 23/49822
USPC ................................ 257/668; 438/622, 637
See application file for complete search history.

(56) References Cited

U.S. PATENT DOCUMENTS

2013/0062108 A1* 3/2013 Kondo ................ H01L 21/4857
174/258

* cited by examiner

*Primary Examiner* — Ajay Arora
(74) *Attorney, Agent, or Firm* — Amin, Turocy & Watson, LLP

(57) ABSTRACT

A flip-chip packaging substrate and a method for fabricating the same are disclosed. The method includes stacking a plurality of insulating layers having conductive posts in a manner that the conductive posts are stacked on and in contact with one another. The insulating layers and the conductive posts serve as a core layer structure of the flip-chip packaging substrate. As such, the conductive posts having small-sized end surfaces can be fabricated according to the practical need. Therefore, when the thickness of the core layer structure is increased, the present disclosure not only increases the rigidity of the flip-chip packaging substrate so as to avoid warping, but also ensures the design flexibility of the small-sized end surfaces of the conductive posts, allowing high-density electrical connection points and fine-pitch and high-density circuit layers to be fabricated on the core layer structure.

3 Claims, 14 Drawing Sheets

FLIP-CHIP PACKAGING SUBSTRATE AND METHOD FOR FABRICATING THE SAME

BACKGROUND

1. Technical Field

The present disclosure relates to flip-chip packaging substrate technologies, and, more particularly, to a flip-chip packaging substrate used in a semiconductor packaging process and a method for fabricating the same.

2. Description of Related Art

In recent years, industry applications have been gradually developed toward 5G high-frequency communication, AR, VR, etc. Accordingly, high-end semiconductor packaging technologies are increasingly demanded so as to be applied in semiconductor flip-chip packages or multi-chip packages such as AI chips, high-end chips and multi-chips. As such, semiconductor packages are required to have an increased packaging size, an increased number of stacking layers, and circuits of high density, fine pitch and high electrical connection point count.

Currently, core layers of flip-chip packaging substrates have an increased thickness so as to meet the requirements of highly integrated chips such as AI chips, more electrical connection points count and a variety of complex circuits and prevent warping from occurring. However, it also results in an increased cross-section size of through holes in the core layer, thereby increasing the pitch between the electrical connection points and hence reducing the number of the electrical connection points per unit area, reducing the circuit density and increasing the circuit pitch. Accordingly, the flip-chip packaging substrates have to become much larger and thicker, thereby increasing the difficulty of the packaging process.

Therefore, flip-chip packaging substrates having a large size of such as 45 mm×45 mm, 70 mm×70 mm or 80 mm×80 mm are used to carry highly integrated chips such as AI chips, high-end chips or multi-chips. FIG. 1A is schematic cross-sectional view of a conventional electronic device 1. The electronic device 1 has a circuit board 18, a large-size flip-chip packaging substrate 1a disposed on the circuit board 18, and a highly integrated semiconductor chip 19 bonded to the flip-chip packaging substrate 1a. Referring to FIG. 1B, the flip-chip packaging substrate 1a has a core layer 10, a build-up structure 11 formed on each of upper and lower sides of the core layer 10, and a solder mask layer 12 formed on the build-up structure 11. A plurality of conductive through holes 100 are formed in the core layer 10 for electrically connecting circuit layers 110 of the build-up structures 11. Each of the build-up structures 11 further has at least a dielectric layer 111 encapsulating the circuit layers 110. The outermost circuit layer 110 of the build-up structure 11 is exposed from the corresponding solder mask layer 12 to serve as electrical connection points 112. The circuit board 18 and the semiconductor chip 19 can further be bonded to the electrical connection points 112 through a solder material 13.

Conventionally, the core layer 10 is made of glass fiber combined with epoxy resin, for example, BT (Bismaleimide Triazine) or FRS. To form the conductive through holes 100 in the core layer 10, a plurality of openings are formed by mechanical or laser drilling. In an embodiment, referring to FIG. 1C, the conductive through hole 100' consists of two tapered vias. Thereafter, a conductive layer is formed in the openings by electroplating or a filling material is filled in the openings to form the conductive through holes 100, 100' of FIGS. 1B and 1C or to form conductive through holes consisting of a conductive material 100a and an insulating material 100b as shown in FIG. 1D.

However, the conventional large-size flip-chip packaging substrate 1a has some drawbacks. For example, due to different CTEs (coefficients of thermal expansion) between the core layer 10 of glass fiber combined with epoxy resin and the other layers of the flip-chip packaging substrate 1a, warping may occur to the packaging substrate 1a during a packaging process, thus adversely affecting the electrical connection between the packaging substrate 1a and the semiconductor chip 19 (for example, the solder material 13' therebetween cracks or does not bond the packaging substrate 1a and the semiconductor chip 19 together) or adversely affecting the electrical connection between the packaging substrate 1a and the circuit board 18 (for example, the solder material 13" therebetween cracks or does not bond the packaging substrate 1a and the circuit board 18 together). More seriously, the semiconductor chip 19 may electrically fail or crack due to stresses.

Therefore, the thickness h of the core layer 10 is increased, for example, from 0.8 mm (in combination with the width w of the opening of 0.1 mm) to 1.2 mm (the width w of the opening is above 0.2 mm) to increase the rigidity and avoid warping of the packaging substrate 1a. However, such a packaging substrate has more drawbacks.

First, the number of the electrical connection points per unit area cannot be increased. In particular, due to the increased thickness of the core layer 10, the size of the end surfaces of the conductive through holes 100, 100' (i.e., the width w of the openings) and hence the pitch between the conductive through holes 100, 100' are increased, thereby reducing the number of the electrical connection points per unit area.

Second, the circuit pitch is increased and the circuit density is reduced. In particular, due to the increased thickness of the core layer 10, the size of the end surfaces of the conductive through holes 100, 100' is increased, thereby occupying more space and hence reducing the space available for the circuit layers 110. Consequently, it is difficult to fabricate the circuit layers 110 with fine pitch and high density.

Third, it becomes more difficult to perform electroplating and filling of the filling material in the conductive through holes 100, 100'. In particular, the increased thickness of the core layer 10 causes the conductive through holes 100, 100' to be deep. As such, it becomes more difficult to perform electroplating and filling of the filling material 100b in the conductive through holes 100, 100'. For example, voided through holes may be formed in the deep conductive through holes 100, 100'.

Fourth, as the thickness of the core layer 10 is increased, the cost and difficulty in fabricating the conductive through holes 100, 100' are also increased. In particular, since the core layer 10 is made of a dielectric material containing glass fiber, when a laser or mechanical drilling process is performed to form deep conductive through holes 100, 100' in the core layer 10, it is difficult to form small-sized end surfaces for the conductive through holes 100, 100'. In addition, the fabrication cost is high.

Therefore, how to overcome the above-described drawbacks has become critical.

SUMMARY

In view of the above-described drawbacks, the present disclosure provides a method for fabricating a flip-chip packaging substrate, which comprises the steps of: providing a carrier with a first insulating layer formed on the carrier; forming a plurality of first conductive posts in the first insulating layer; forming at least a second insulating layer on the first insulating layer, wherein the first insulating layer and the second insulating layer serve as an insulating portion; forming a plurality of second conductive posts in the second insulating layer in a manner that the second conductive posts are stacked on and in contact with the first conductive posts, wherein the second conductive posts and the first conductive posts serve as conductive portions, and the insulating portion and the conductive portions serve as a core layer structure having opposite first and second surfaces; removing the carrier; and forming a circuit portion on the first and second surfaces of the core layer structure at the same or different times with the circuit portion electrically connected to the conductive portions.

The present disclosure provides another method for fabricating a flip-chip packaging substrate, which comprises the steps of: providing a carrier with a plurality of conductive posts stacked on and in contact with one another on the carrier, wherein the conductive posts serve as conductive portions; forming on the carrier an insulating portion that encapsulates the conductive portions, wherein the insulating portion and the conductive portions serve as a core layer structure having opposite first and second surfaces; removing the carrier; and forming a circuit portion on the first and second surfaces of the core layer structure at the same or different times with the circuit portion electrically connected to the conductive portions.

The present disclosure provides a further method for fabricating a flip-chip packaging substrate, which comprises the steps of: providing an insulating portion having opposite first and second sides; forming a plurality of first openings on the first side of the insulating portion; forming on the second side of the insulating portion a plurality of second openings corresponding in position to the first openings, wherein corresponding ones of the first and second openings communicate with each other; forming first conductive posts in the first openings, and forming second conductive posts in the second openings, in a manner that the first conductive posts and the second conductive posts are stacked on and in contact with one another, wherein the second conductive posts and the first conductive posts serve as conductive portions, and the insulating portion and the conductive portions serve as a core layer structure having opposite first and second surfaces; and forming a circuit portion on the first and second surfaces of the core layer structure at the same or different times with the circuit portion electrically connected to the conductive portions.

In an embodiment, the conductive posts can be formed by electroplating, deposition or filling.

The present disclosure further provides a flip-chip packaging substrate, which comprises: a plurality of conductive portions, each of which has a plurality of conductive posts stacked on and in contact with one another; an insulating portion encapsulating the conductive portions, wherein the insulating portion and the conductive portions serve as a core layer structure having opposite first and second surfaces; and a circuit portion formed on at least one of the first and second surfaces of the core layer structure and electrically connected to the conductive portions.

In an embodiment, end surfaces of the conductive posts that are stacked on one another can have the same or different sizes. In another embodiment, the end surfaces of the first conductive posts and the second conductive posts have the same or different sizes.

In an embodiment, the insulating portion can be made of an organic dielectric material free of glass fiber (for example, a solder mask material) or an inorganic dielectric material free of glass fiber (for example, an insulating oxide). In another embodiment, the organic dielectric material can further comprise a molding compound, an epoxy molding compound (EMC) or a primer.

In an embodiment, the circuit portion can be a single-layer circuit or a build-up layer.

In an embodiment, the conductive portions can be directly or indirectly electrically connected to the circuit portion.

According to the present disclosure, when the thickness of the insulating portion is increased so as to increase the rigidity of the flip-chip packaging substrate, the end surfaces of the conductive portions do not need to be increased. Even further, the end surfaces of the conductive portions can be reduced. Compared with the prior art, the present disclosure not only increases the rigidity of the flip-chip packaging substrate so as to avoid warping, but also allows miniaturization design of the end surfaces of the conductive portions according to the practical need. Therefore, the present disclosure increases the number of electrical connection points per unit area and allows fabrication of fine-pitch and high-density circuit layers so as to meet the packaging requirement of highly integrated chips.

BRIEF DESCRIPTION OF DRAWINGS

FIG. 2C' shows another embodiment of FIG. 2C; FIG. 2D' is a schematic upper view of FIG. 2D; FIG. 2E' is a schematic partially perspective view of FIG. 2E; and FIG. 2F' shows another embodiment of FIG. 2F;

FIG. 2F-1 shows another embodiment of FIG. 2F;

FIG. 2F-2 shows another embodiment of FIG. 2F';

FIG. 2G' is a schematic cross-sectional view showing application of FIG. 2F-2;

DETAILED DESCRIPTION OF EMBODIMENTS

The following illustrative embodiments are provided to illustrate the disclosure of the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first", "second", "third", "a" etc. are merely for illustrative purposes and should not be construed to limit the scope of the present disclosure.

FIGS. 2A to 2F are schematic cross-sectional views showing a method for fabricating a flip-chip packaging substrate 3, 3' according to a first embodiment of the present disclosure.

Figure 1A:
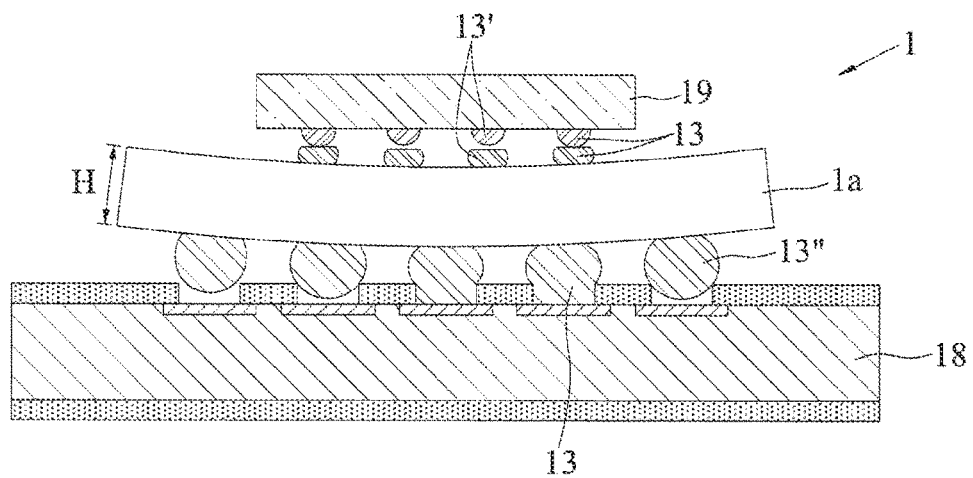
FIG. 1A is a schematic cross-sectional view of a conventional electronic device.
Figure 1B:
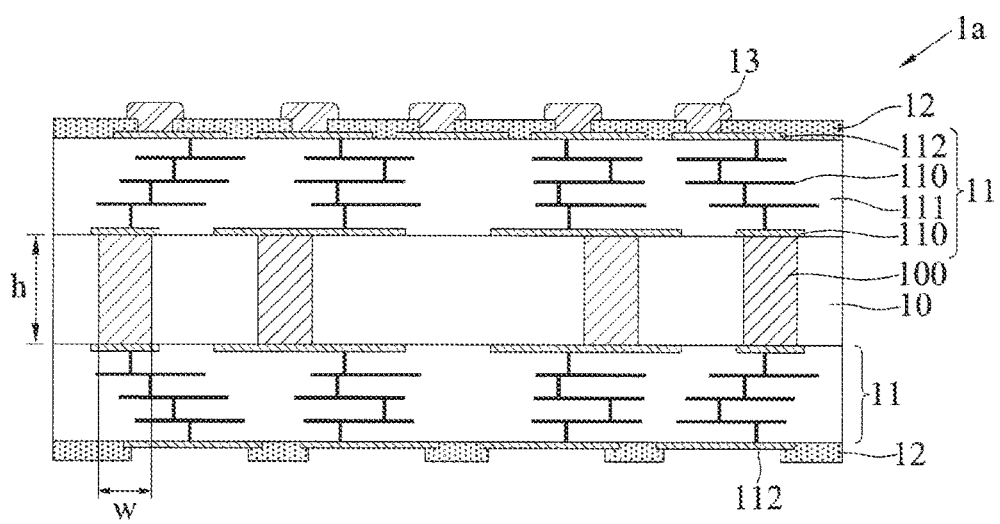
FIG. 1B is a schematic cross-sectional view of a conventional packaging substrate.
Figure 1C:
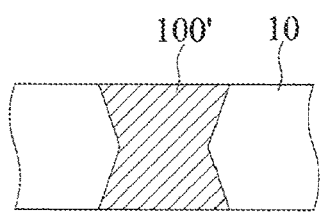
FIGS. 1C and 1D are schematic cross-sectional views of various conventional conductive through holes.
Figure 1D:
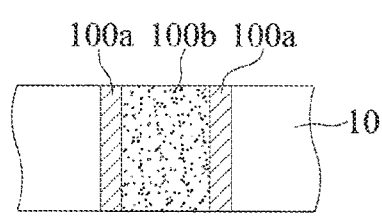
Figure 2A:
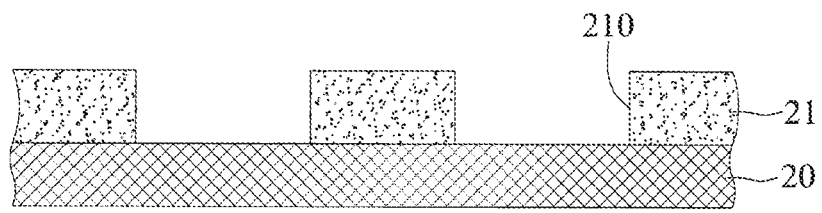
FIGS. 2A to 2F are schematic cross-sectional views showing a method for fabricating a flip-chip packaging substrate according to a first embodiment of the present disclosure, wherein FIG. 2B' is a schematic upper view of FIG. 2B.
Figure 2B:
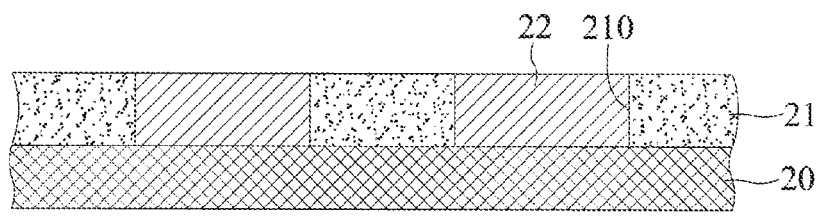
Figure 2B:
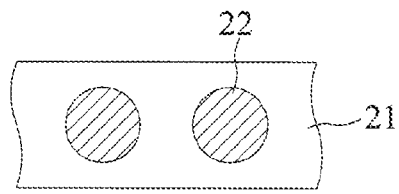
Figure 2C:
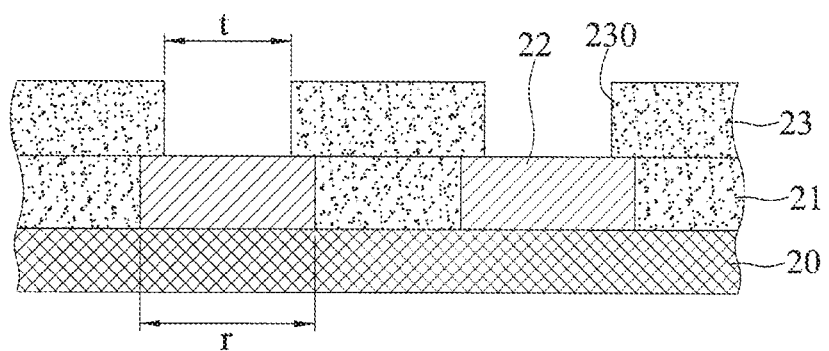
Figure 2C:
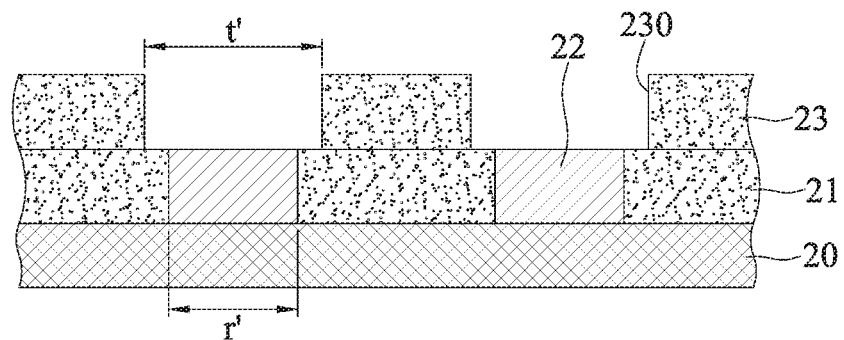
Figure 2D:
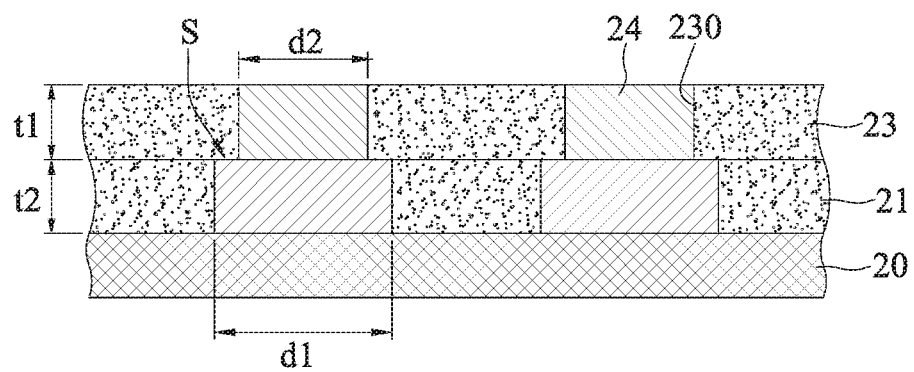
Figure 2D:
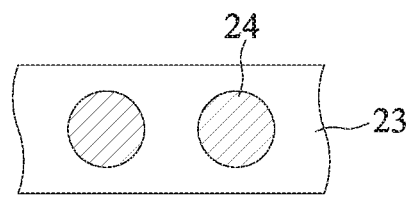
Figure 2E:
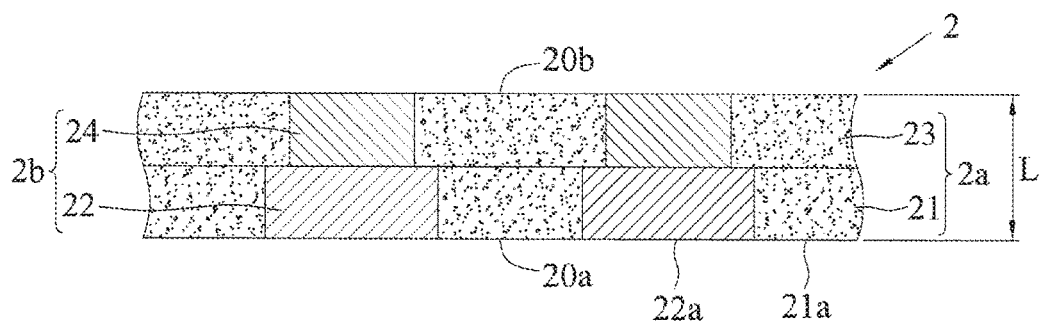
Figure 2E:
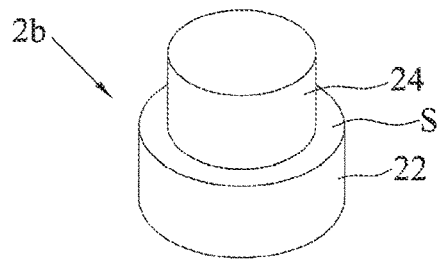

Referring to FIG. 2A, the thickness of a core layer structure 2 (as shown in FIG. 2E) is determined according to the packaging requirement and hence the number of the layers of the core layer structure 2 is determined (in an embodiment, as shown in FIG. 2E, two layers are provided). Then, a first insulating layer 21 is formed on a carrier 20, and a plurality of first through holes 210 are formed in the first insulating layer 21 through a patterning process.

In an embodiment, the first insulating layer 21 is formed by molding, coating or lamination. In another embodiment, the first insulating layer 21 is made of an organic dielectric material without glass fiber (for example, a solder mask material), or an inorganic dielectric material without glass fiber (for example, an insulating oxide). In yet another embodiment, the organic dielectric material further contains a molding compound, an epoxy molding compound (EMC) or a primer.

Further, since the first insulating layer 21 has a small thickness, the first through holes 210 having small-sized end surfaces can be easily and quickly formed in the first insulating layer 21 by laser.

Referring to FIG. 2B, a plurality of first conductive posts 22 are formed in the first through holes 210 of the first insulating layer 21.

In an embodiment, referring to FIG. 2B', no circuit extends around the first conductive posts 22.

Further, the first conductive posts 22 can be formed by electroplating or deposition. Alternatively, the first conductive posts 22 can be formed by filling a conductive material such as a solder paste or a conductive adhesive in the first through holes 210.

Referring to FIG. 2C, a second insulating layer 23 is formed on the first insulating layer 21 and a patterning process is performed to form a plurality of second through holes 230 in the second insulating layer 23 for exposing the first conductive posts 22.

In an embodiment, the second insulating layer 23 is formed by molding, coating or lamination. In another embodiment, the second insulating layer 23 is made of an organic dielectric material without glass fiber (for example, a solder mask material), or an inorganic dielectric material without glass fiber (for example, an insulating oxide). In yet another embodiment, the organic dielectric material further contains a molding compound, an epoxy molding compound (EMC) or a primer.

Further, since the second insulating layer 23 has a small thickness, the second through holes 230 having small-sized end surfaces can be easily and quickly formed in the second insulating layer 23 by laser.

In an embodiment, the width t of the second through holes 230 can be the same as or different from the width r of the first through holes 210. In another embodiment, the width t of the second through holes 230 is less than the width r of the first through holes 210. In yet another embodiment, referring to FIG. 2C', the width t' of the second through holes 230 is greater than the width r' of the first through holes 210.

Referring to FIG. 2D, continued from the process of FIG. 2C, a plurality of second conductive posts 24 are formed in the second through holes 230 of the second insulating layer 23 by electroplating, deposition or filling. The second conductive posts 24 are stacked on and in contact with the first conductive posts 22. The width d1 of the first conductive posts 22 (about 0.06 mm) is different from the width d2 (about 0.04 mm) of the second conductive posts 24. As such, a step-shaped interface S is formed between ends surfaces of the first conductive posts 22 and the corresponding second conductive posts 24.

In an embodiment, referring to FIG. 2D', no circuit extends around the second conductive posts 24.

Referring to FIG. 2E, the carrier 20 is completely removed to expose end surfaces 22a of the first conductive posts 22 and a surface 21a of the first insulating layer 21.

In an embodiment, the first insulating layer 21 and the second insulating layer 23 can be regarded as an insulating portion 2a, and the first conductive posts 22 and the second conductive posts 24 stacked thereon can be regarded as conductive portions 2b, as shown in FIG. 2E'. The insulating portion 2a and the conductive portions 2b serve as a core layer structure 2 of the flip-chip packaging substrate 3. The core layer structure 2 has opposite first and second surfaces 20a, 20b.

Since the core layer structure 2 is formed by stacking a plurality of insulating layers, the total thickness of the core layer structure 2 can be increased while maintaining the design of small-sized openings and fine pitch. In an embodiment, the thickness L of the core layer structure 2 is required to be 12 mm, and the core layer structure 2 can be formed by stacking two insulating layers each having a thickness of 0.6 mm. In another embodiment, referring to FIG. 2D, both the thickness t1 of the second insulating layer 23 and the thickness t2 of the first insulating layer 21 are 0.6 mm. In yet another embodiment, referring to FIGS. 5A to 5D, the core layer structure 2 can be formed by stacking three insulating layers each having a thickness of 0.4 mm. As such, since each of the insulating layers has a small thickness, the conductive posts can be fabricated with small-sized end surfaces, thereby effectively increasing the number of the electrical connection points per unit area, increasing the circuit density and reducing the circuit pitch.

Further, the molding compound or primer of the insulating portion 2a has good rigidity to prevent warping. Therefore, the carrier 20 can be completely removed without causing warping of the core layer structure 2.

Figure 2F:
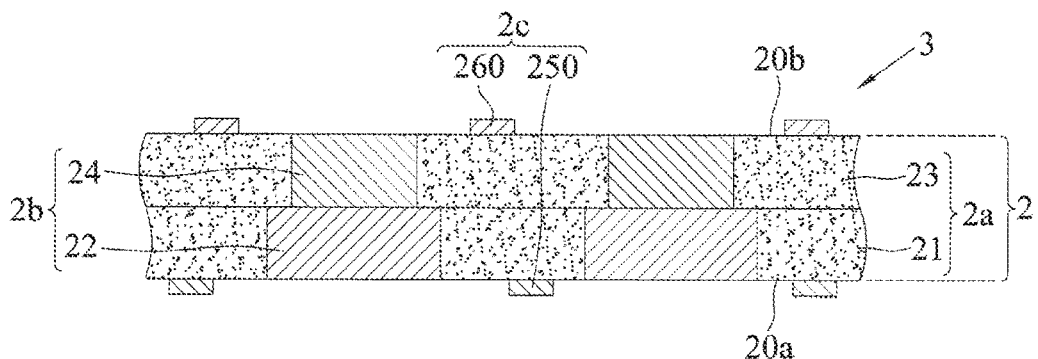
Figure 2F:
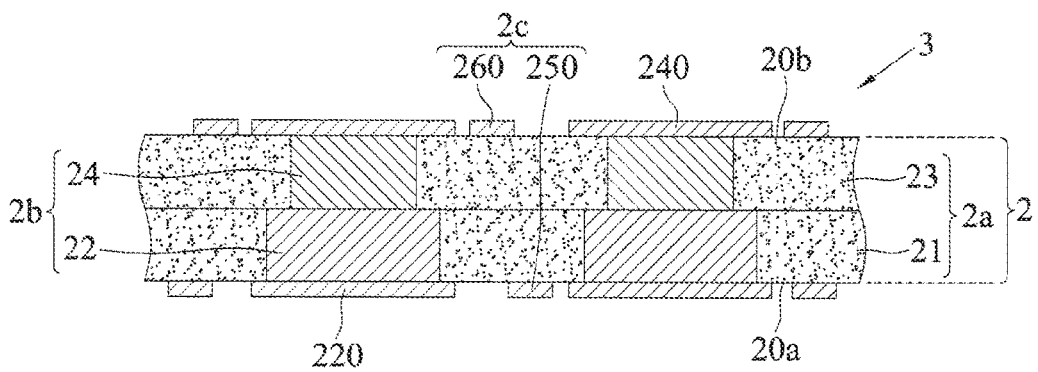

Referring to FIG. 2F, a circuit portion 2c is formed on the core layer structure 2. The circuit portion 2c can be a single-layer circuit. In an embodiment, the circuit portion 2c has a first circuit layer 250 formed on the first surface 20a of the core layer structure 2 and electrically connected to the first conductive posts 22 and a second circuit layer 260 formed on the second surface 20b of the core layer structure 2 and electrically connected to the second conductive posts 24. The first circuit layer 250 and the second circuit layer 260 can be formed at the same or different times. In an embodiment, the first circuit layer 250 is directly electrically connected to the first conductive posts 22, and the second circuit layer 260 is directly electrically connected to the second conductive posts 24. In another embodiment, referring to FIG. 2F', the first circuit layer 250 is indirectly electrically connected to the first conductive posts 22 through a plurality of conductive pads 220 and the second circuit layer 260 is indirectly electrically connected to the second conductive posts 24 through a plurality of conductive pads 240.

Figures 1, 2F:
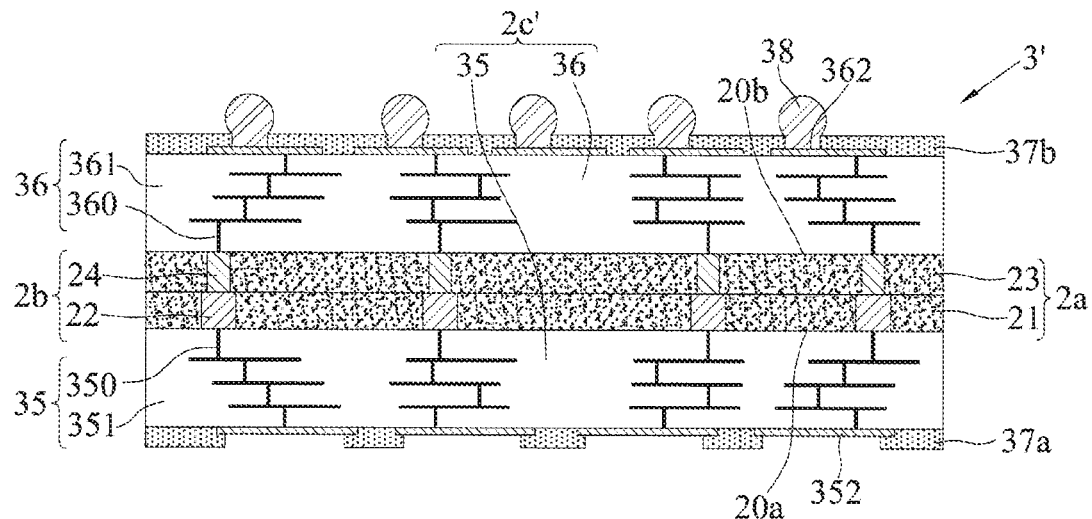
Figures 2, 2F:
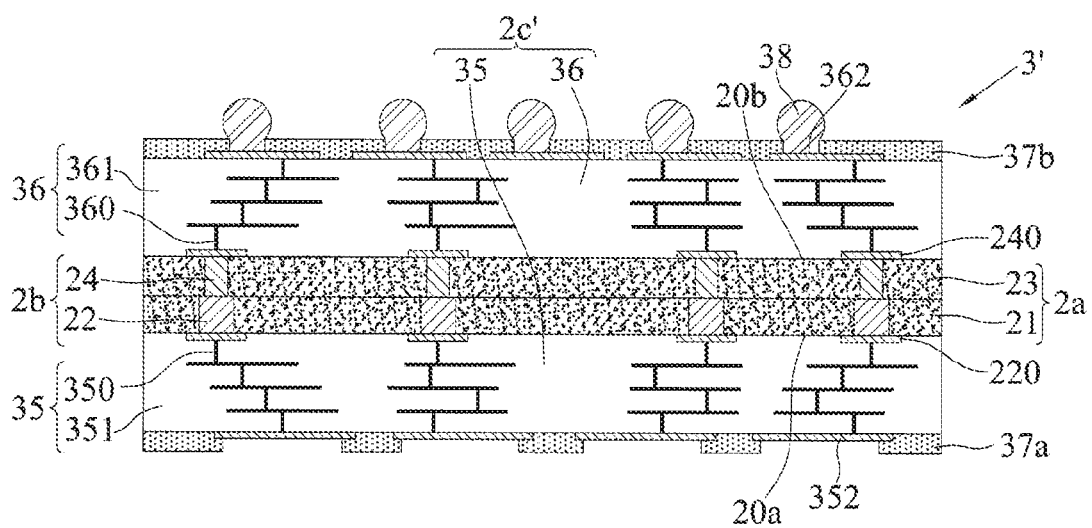

In an embodiment, the circuit portion 2c' can be a build-up layer. That is, the number of the circuit layers can be designed according to the practical need. In an embodiment, referring to a flip-chip packaging substrate 3' of FIG. 2F-1, the circuit portion 2c' has a first circuit structure 35 formed on the first surface 20a of the core layer structure 2. The first circuit structure 35 has at least a first dielectric layer 351 and a plurality of first circuit layers 350 bonded to the first dielectric layer 351. The first circuit layers 350 can be directly electrically connected to the first conductive posts 22 (as shown in FIG. 2F-1) or indirectly electrically connected to the first conductive posts 22 through a plurality of conductive pads 220 (as shown in FIG. 2F-2). An insulating layer 37a is formed on the first circuit structure 35 and the outermost first circuit layer 350 is exposed from the insulating layer 37a to serve as conductive pads 352 for mounting solder bumps (not shown). Further, the circuit portion 2c' has a second circuit structure 36 formed on the second surface 20b of the core layer structure 2. The second circuit structure 36 has at least a second dielectric layer 361 and a plurality of second circuit layers 360 bonded to the second dielectric layer 361. The second circuit layers 360 can be directly electrically connected to the second conductive posts 24 (as shown in FIG. 2F-1), or indirectly electrically connected to the second conductive posts 24 through a plurality of conductive pads 240 (as shown in FIG. 2F-2). An insulating layer 37b is further formed on the second circuit structure 36 and the outermost second circuit layer 360 is exposed from the insulating layer 37b to serve as conductive pads 362 for mounting solder bumps 38.

In an embodiment, the first and second dielectric layers 351, 361 are made of an epoxy resin, such as ABF, prepreg or EMC. In another embodiment, the insulating layers 37a, 37b are made of a solder mask material, such as photosensitive ink, ABF or a non-photosensitive dielectric material such as EMC.

In an embodiment, the circuit portion 2c, 2c' is electrically connected to the first or second conductive posts 22, 24 through the conductive pads 220, 240, and an additional heat dissipating effect can be achieved.

Subsequently, referring to an electronic package 3" of FIG. 2G or 2G', an electronic component 30 is disposed in a flip-chip manner on the second circuit layer 260 of the flip-chip packaging substrate 3 or the conductive pads 362 of the flip-chip packaging substrate 3' through a plurality of conductive bumps 31 and/or the solder bumps 38. Further, an underfill 32 is formed to encapsulate the conductive bumps 31 and/or the solder bumps 38 or an encapsulant (not shown) is formed to encapsulate the electronic component 30. In an embodiment, a plurality of conductive elements 39, such as solder balls, are formed on the first circuit layer 250 of the flip-chip packaging substrate 3 or the conductive pads 352 of the flip-chip packaging substrate 3' for bonding with a circuit board (not shown).

The electronic component 30 is an active element, such as a semiconductor chip, a passive element, such as a resistor, a capacitor or an inductor, or a combination thereof.

The encapsulant can be a thin film used in a lamination process, a molding compound used in a molding process or an adhesive used in a printing process. The encapsulant can be made of polyimide, a dry film, an epoxy resin, or a molding compound.

When the thickness L of the core layer structure 2 (or the insulating portion 2a) is increased, for example, from 0.8 mm to 1.2 or 1.6 mm so as to increase the rigidity of the flip-chip packaging substrate 3, 3', the width d1 of the first conductive posts 22 or the width d2 of the second conductive posts 24 can be designed to be 0.04 mm to 0.06 mm, which is far less than the width of the openings (above 0.1 or 0.2 mm) formed by the conventional drilling process. Therefore, compared with the prior art, the present disclosure can minimize the size of the end surfaces of the conductive portions 2b so as to increase the circuit density of the first circuit layers 250, 350 or the second circuit layers 260, 360 and increase the number of the conductive pads 352, 362 per unit area.

Further, the insulating portion 2a can be made of a high-rigidity material so as to prevent warping. As such, a high-rigidity flip-chip packaging substrate 3, 3' can be obtained without the need to further increase the thickness L of the core layer structure. In an embodiment, the thickness L of the core layer structure 2 is maintained at 0.8 mm, each of the two insulating layers has a thickness of 0.4 mm, and the width d1 of the first conductive posts 22 or the width d2 of the second conductive posts 24 is 0.04 mm to 0.06 mm.

Figure 5A:
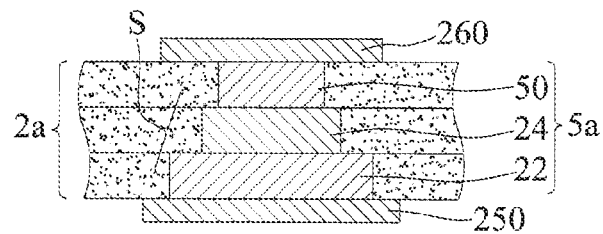
FIGS. 5A to 5E are schematic cross-sectional views showing a core layer structure of a flip-chip packaging substrate according to different embodiments of the present disclosure.
Figure 5B:
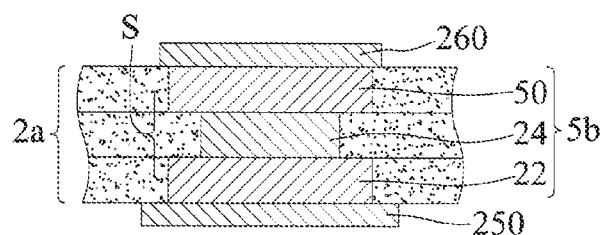
Figure 5C:
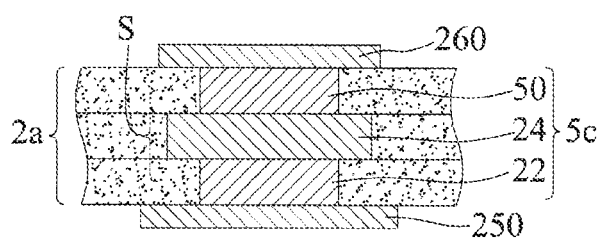
Figure 5D:
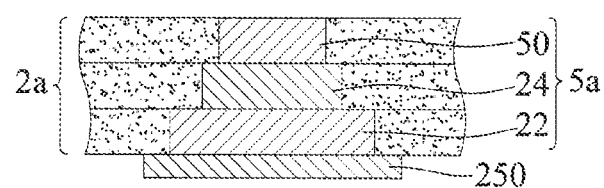
Figure 5E:
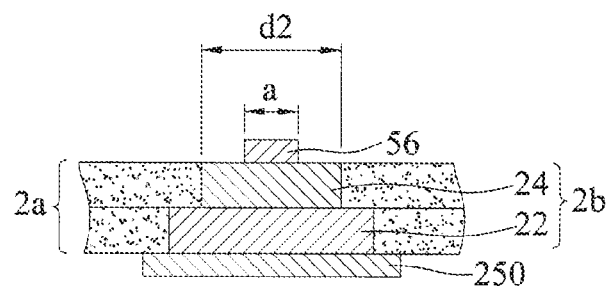

In another embodiment, the number of the stacking layers of the conductive portions 2b, the size of the end surfaces of the conductive posts or the layout of the circuit layers can be designed according to the practical need. FIGS. 5A to 5C show conductive portions 5a, 5b and 5c according to different embodiments of the present disclosure. Referring to FIGS. 5A to 5C, each of the conductive portions 5a, 5b and 5c has a first conductive post 22, a second conductive post 24 and a third conductive post 50 stacked on one another. The end surfaces of the first, second and third conductive posts can have the same or different sizes. As shown in FIG. 5A, the width of the second conductive post 24 is less than the width of the first conductive post 22 but greater than the width of the third conductive post 50. As shown in FIG. 5B, the width of the second conductive post 24 is less than those of the first and third conductive posts 22, 50. As shown in FIG. 5C, the width of the second conductive post 24 is greater than those of the first and third conductive posts 22, 50. Further, referring to FIG. 5D, the second circuit layer 260 on the conductive portion 5a is dispensed with. Referring to FIG. 5E, the width a of the second circuit layer 56 is less than the width of the end surface of the conductive portion 2b (or the width d2 of the second conductive post 24).

FIGS. 3A to 3G are schematic cross-sectional views showing a method for fabricating a flip-chip packaging substrate 3, 3' according to a second embodiment of the present disclosure. The second embodiment differs from the first embodiment in the fabrication process of the core layer structure.

Figure 3A:
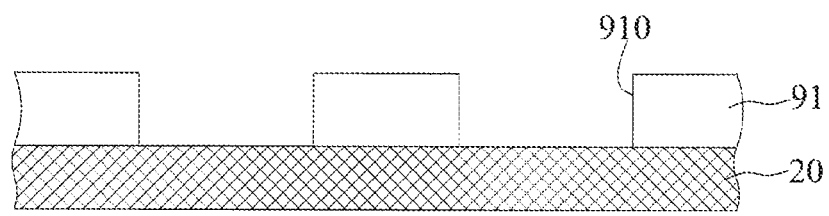
FIGS. 3A to 3G are schematic cross-sectional views showing a method for fabricating a flip-chip packaging substrate according to a second embodiment of the present disclosure, wherein FIG. 3G' shows another embodiment of FIG. 3G.

Referring to FIG. 3A, a first resist layer 91 is formed on a carrier 20, and a plurality of first open areas 910 are formed in the first resist layer 91 through a patterning process.

In an embodiment, the first resist layer 91 is made of a photoresist material and the open areas are formed by image transfer (exposure and development).

Figure 3B:
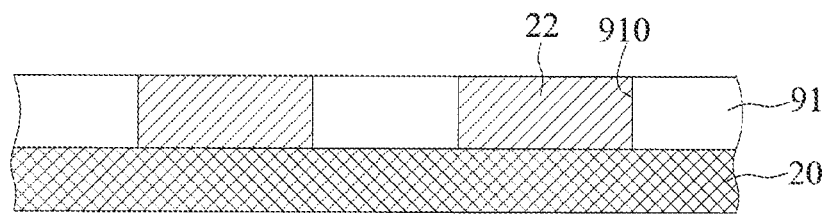

Referring to FIG. 3B, a plurality of first conductive posts 22 are formed in the first open areas 910 of the first resist layer 91 by electroplating or deposition.

Figure 3C:
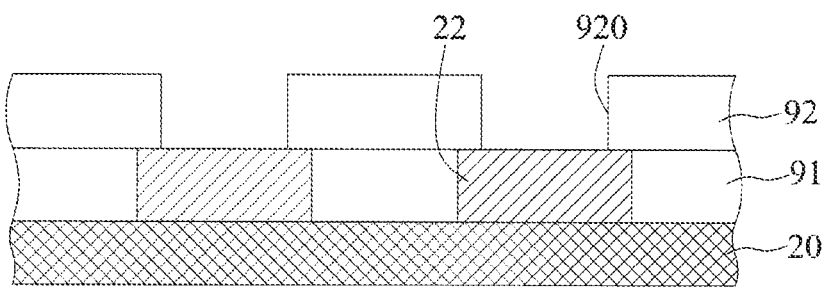

Referring to FIG. 3C, a second resist layer 92 is formed on the first resist layer 91 and a patterning process is performed to form a plurality of second open areas 920 in the second resist layer 92 for exposing the first conductive posts 22.

In an embodiment, the second resist layer 92 is made of a photoresist material and the open areas are formed by image transfer (exposure and development).

Further, the width of the second open areas 920 can be the same as or different from the width of the first open areas 910.

Figure 3D:
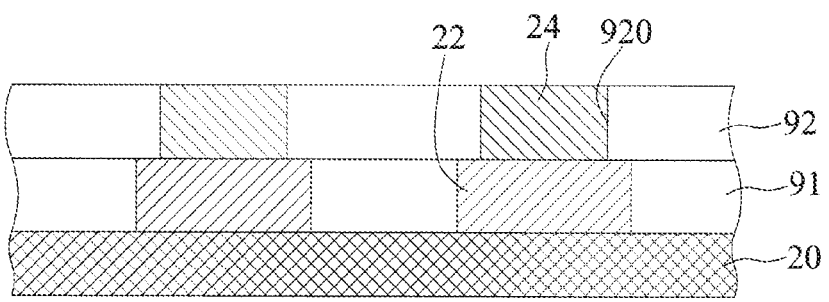

Referring to FIG. 3D, a plurality of second conductive posts 24 are formed in the second open areas 920 of the second resist layer 92 by electroplating or deposition, and the second conductive posts 24 are stacked on and in contact with the first conductive posts 22.

Figure 3E:
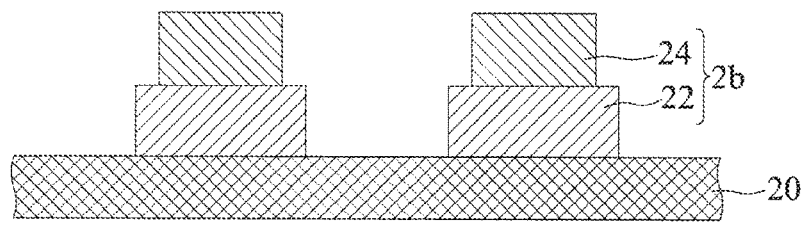

Referring to FIG. 3E, the first and second resist layers 91, 92 are removed, and the first and second conductive posts 22, 24 serve as conductive portions 2b.

Figure 3F:
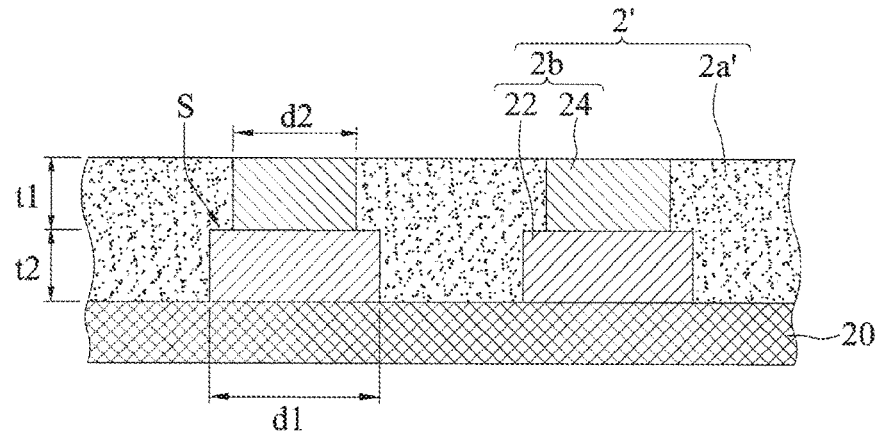

Referring to FIG. 3F, an insulating portion 2a' is formed on the carrier 20 to encapsulate the conductive portions 2b. As such, the insulating portion 2a' and the conductive portions 2b serve as a core layer structure 2', which is similar to the core layer structure 2 of FIG. 2D. The core layer structure 2' differs from the core layer structure 2 in the insulating portion 2a, 2a'.

Figure 3G:
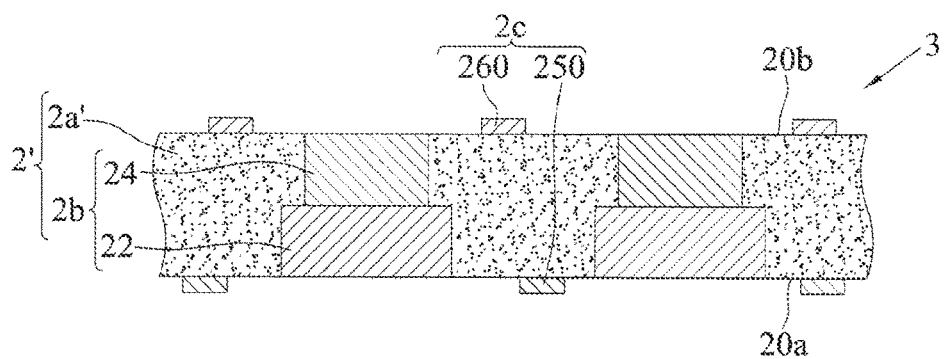
Figure 3G:
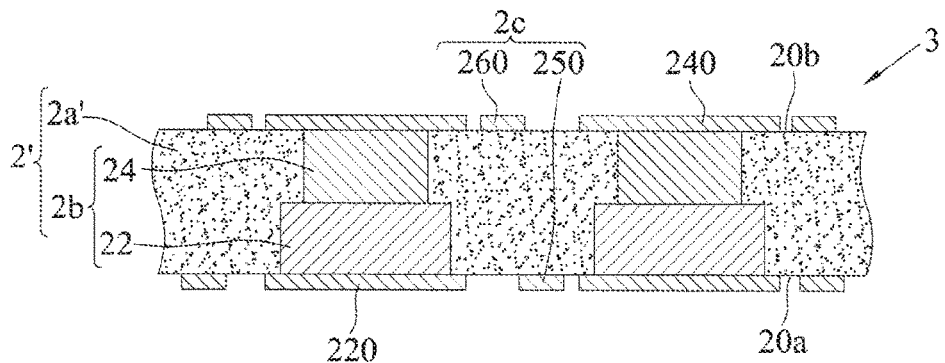
Figure 3H:
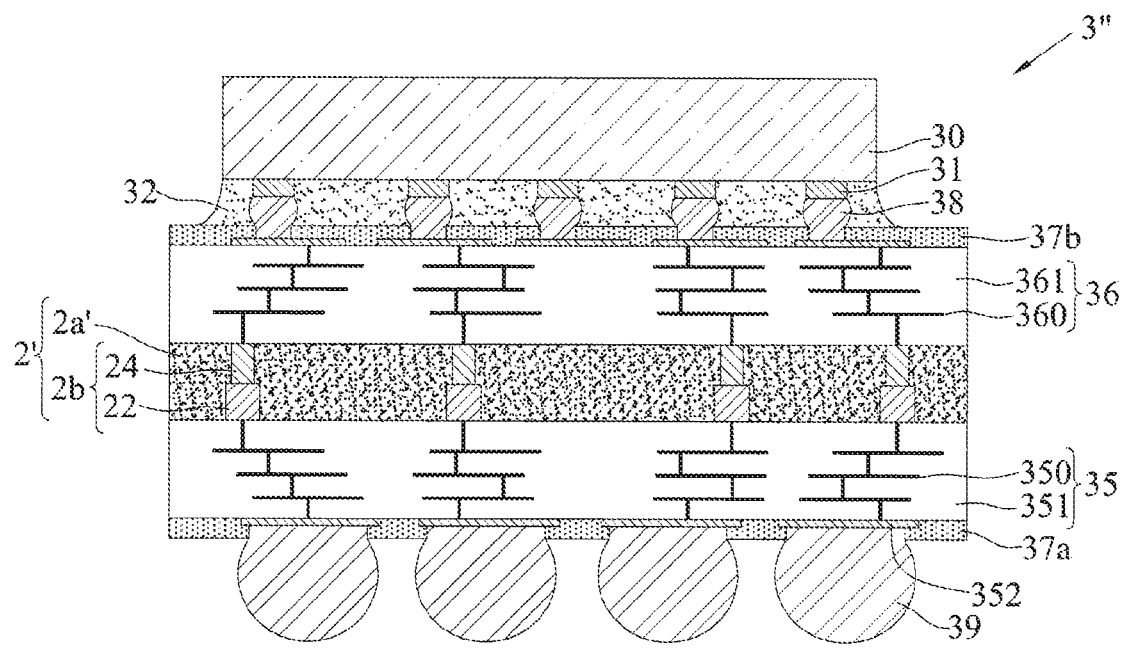
FIG. 3H is a schematic cross-sectional view showing application of FIG. 3G.
Figure 3H:
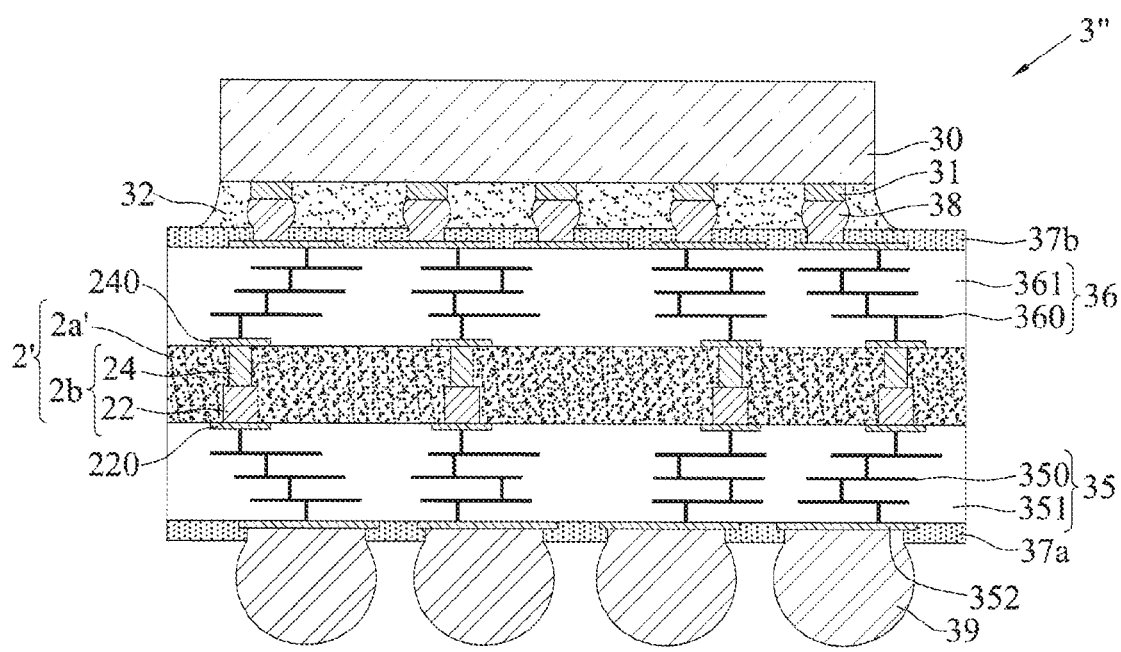

Referring to FIGS. 3G and 3G', continued from the process of FIG. 2D, processes such as removing the carrier 20, forming the circuit portion 2c, 2c' (optionally forming the conductive pads 220, 240) and a packaging process can be performed, as shown in FIG. 3H or 3H'.

FIGS. 4A to 4D are schematic cross-sectional views showing a method for fabricating a flip-chip packaging substrate 4, 4' according to a third embodiment of the present disclosure. The third embodiment differs from the first embodiment in the fabrication process of the core layer structure.

Figure 4A:
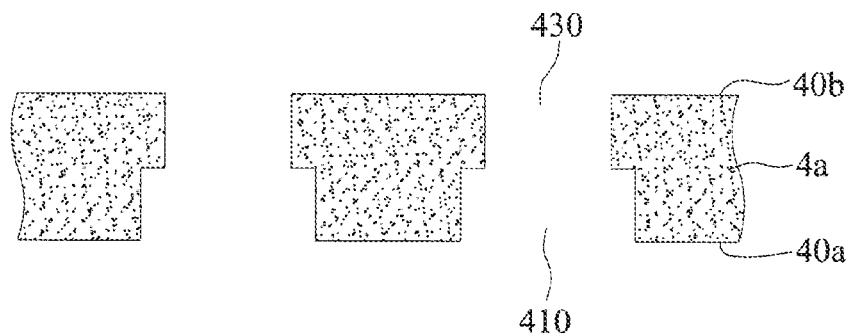
FIGS. 4A to 4D are schematic cross-sectional views showing a method for fabricating a flip-chip packaging substrate according to a third embodiment of the present disclosure, wherein FIG. 4D' shows another embodiment of FIG. 4D.

Referring to FIG. 4A, an insulating portion 4a having a first side 40a and a second side 40b opposite to the first side 40a is provided. A plurality of first openings 410 are formed on the first side 40a of the insulating portion 4a and a plurality of second openings 430 are formed on the second side 40a of the insulating portion 4a, corresponding in position to the first openings 410. The corresponding ones of the first and second openings 410, 430 communicate with each other.

Figure 4B:
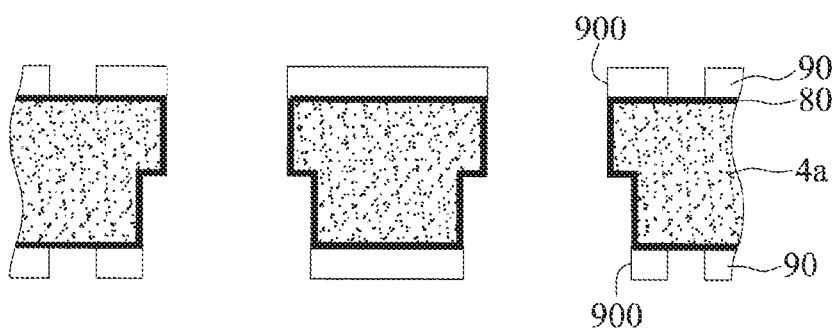

Referring to FIG. 4B, a seed layer 80 is formed on the first side 40a and the second side 40b of the insulating portion 4a and in the first openings 410 and the second openings 430. Then, a resist layer 90 is formed on the first side 40a and the second side 40b of the insulating portion 4a and a plurality of open areas 900 are formed in the resist layer 90 for communicating with the first openings 410 and the second openings 430 and exposing portions of the seed layer on the first side 40a and the second side 40b of the insulating portion 4a.

Figure 4C:
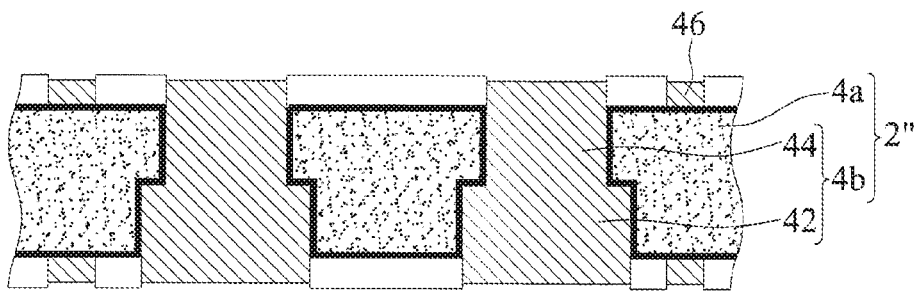

Referring to FIG. 4C, a metal material 46 is formed in the open areas 900, the first openings 410 and the second openings 430. The metal material 46 in the first openings 410 serves as first conductive posts 42. The metal material 46 in the second openings 430 serves as second conductive posts 44. The first conductive posts 42 and the second conductive posts 44 stacked on and integrally formed with the first conductive posts 42 serve as conductive portions 4b.

The insulating portion 4a and the conductive portions 4b serve as a core layer structure 2".

Figure 4D:
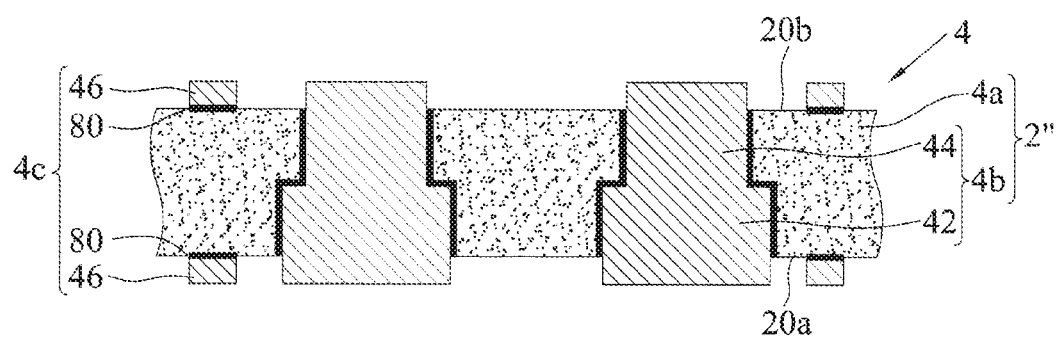
Figure 4D:
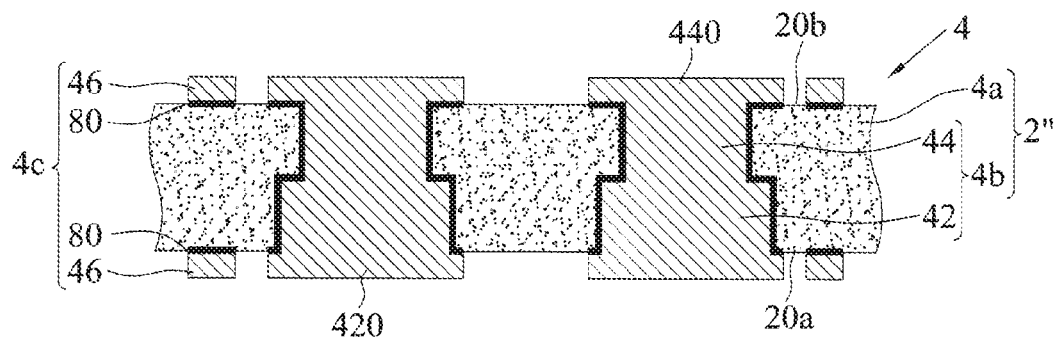

Referring to FIG. 4D, the resist layer 90 and the seed layer 80 under the resist layer 90 are removed. The metal material 46 in the open areas 900 serves as a circuit portion 4c. As such, a flip-chip packaging substrate 4 is formed. The circuit portion 4c is electrically connected to the conductive portions 4b. The core layer structure 2" has a first surface 20a and a second surface 20b corresponding to the first side 40a and the second side 40b of the insulating portion 40, respectively.

In an embodiment, the conductive portions 4b and the circuit portion 4c are integrally formed through the same process.

Figure 4E:
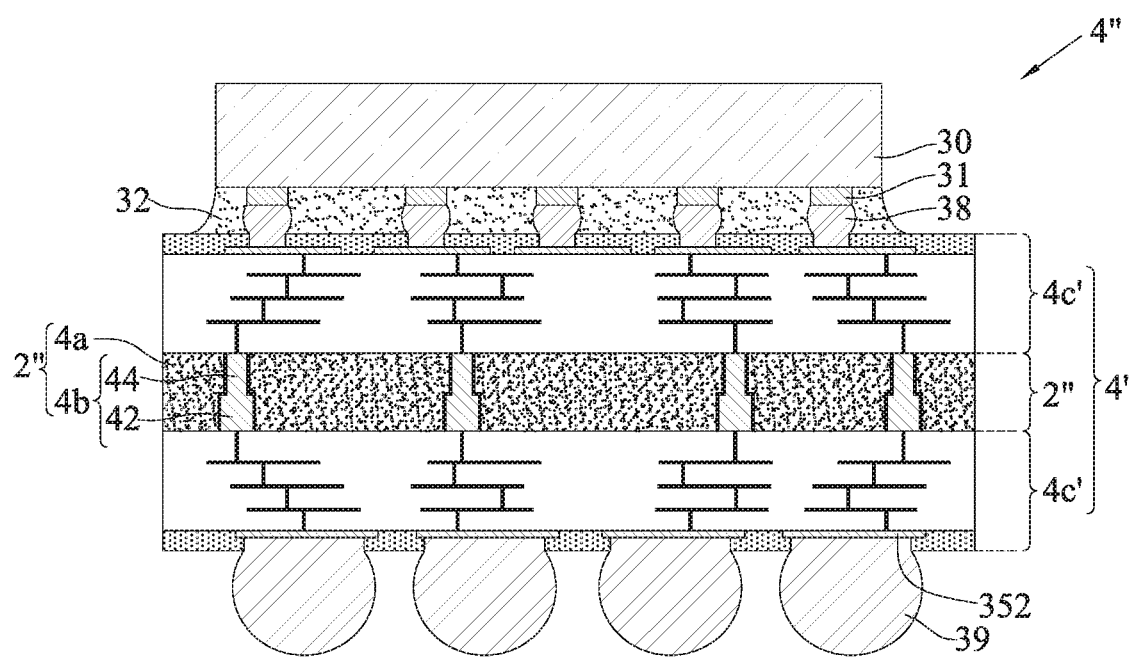
FIG. 4E is a schematic cross-sectional view showing application of FIG. 4D.
Figure 4E:
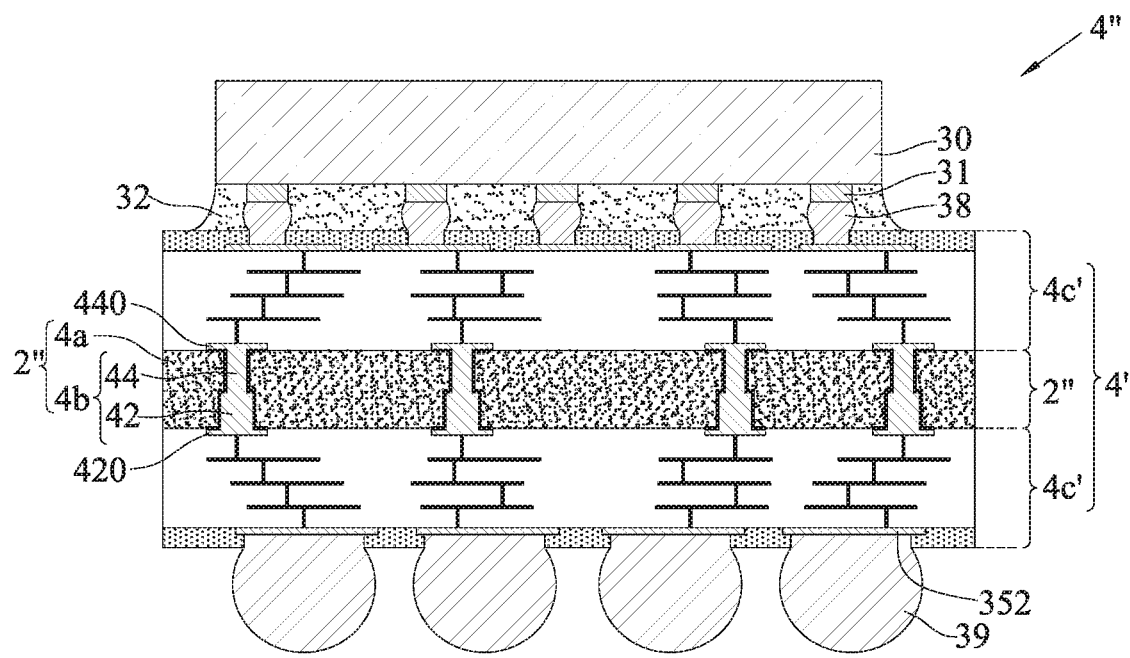

Further, the circuit portion 4c can be a single-layer circuit, as shown in FIG. 4D or 4D', or the circuit portion 4c' is a redistribution layer, as shown in FIG. 4E or 4E'.

Furthermore, the circuit portion 4c, 4c' is directly electrically connected to the first conductive posts 42 or the second conductive posts 44, as shown in FIG. 4D or 4E. Alternatively, referring to FIG. 4D' or 4E', the circuit portion 4c, 4c' is indirectly electrically connected to the first conductive posts 42 or the second conductive posts 44 through conductive pads 420, 440. The conductive pads 420, 440 are integrally formed with the circuit portion 4c, 4c'.

Figure 2G:
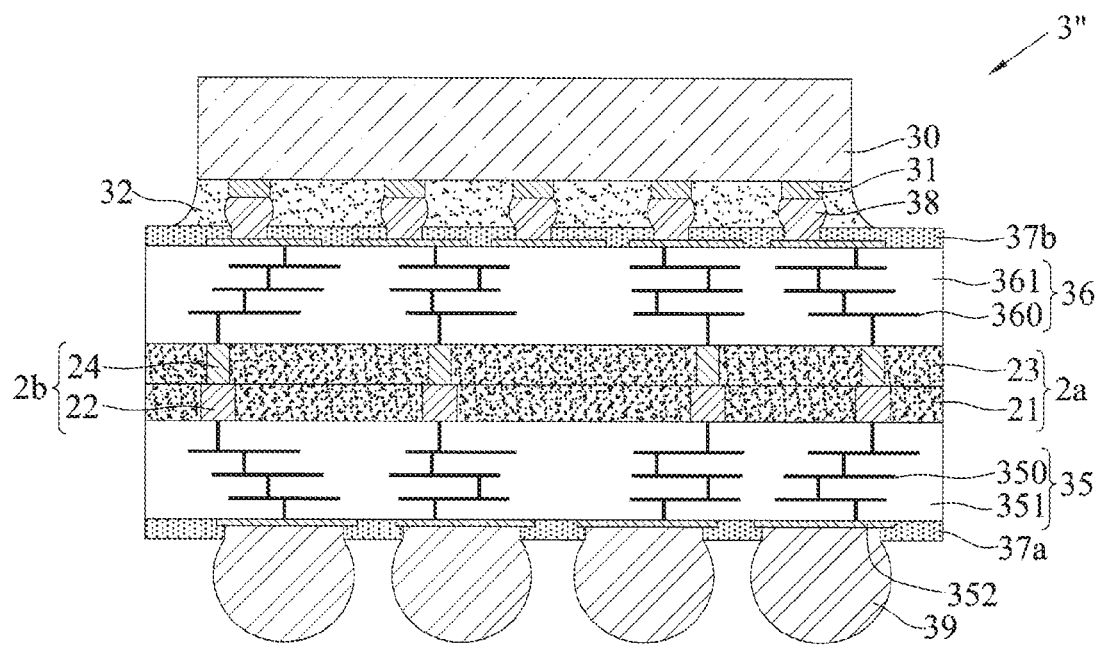
FIG. 2G is a schematic cross-sectional view showing application of FIG. 2F-1.
Figure 2G:
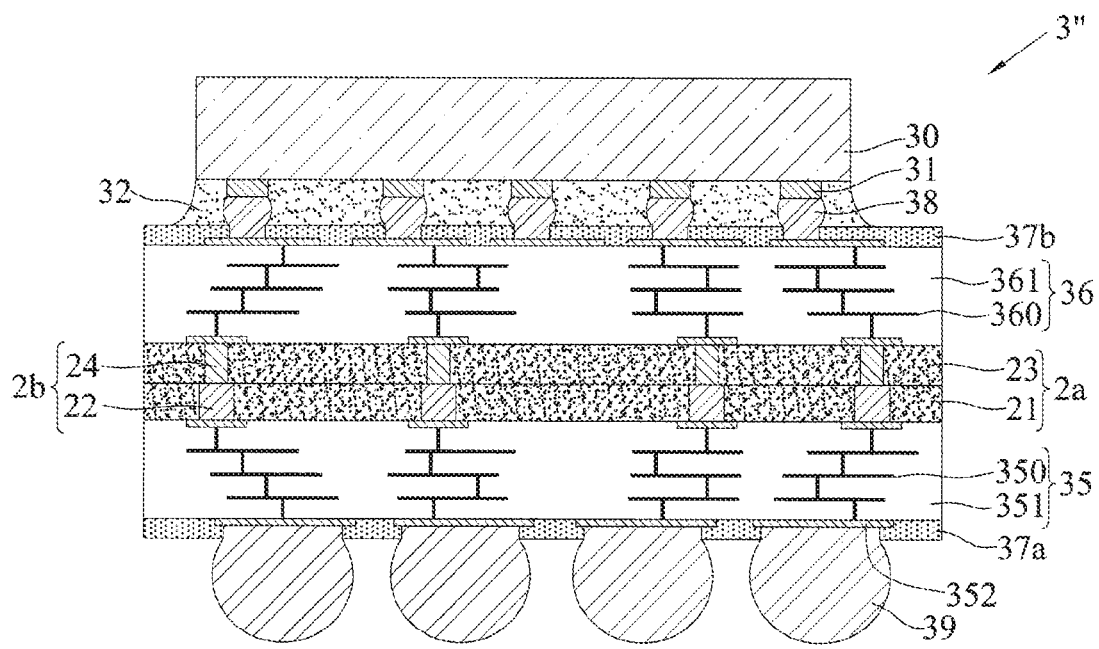

In addition, referring to FIG. 4E or 4E', after the flip-chip packaging substrate 4, 4' is fabricated, the packaging process of FIG. 2G or 2G' is performed to obtain an electronic package 4".

The present disclosure further provides a flip-chip packaging substrate 3, 3', 4, 4', which has: a plurality of conductive portions 2b, 4b, each of which has at least a first conductive post 22 and a second conductive post 24 stacked on and in contact with one another; an insulating portion 2a, 2a', 4a encapsulating the conductive portions 2b, 4b, wherein the insulating portion 2a, 2a', 4a and the conductive portions 2b, 4b serve as a core layer structure 2, 2', 2" having opposite first and second surfaces 20a, 20b; and a circuit portion 2c, 2c', 4c,4c' formed on the first and second surfaces 20a, 20b of the core layer structure 2, 2', 2" and electrically connected to the conductive portions 2b, 4b.

The width d1 of the first conductive post 22 can be the same as or different from the width d2 of the second conductive post 24. As such, the conductive portion 2b has an even peripheral surface or an uneven peripheral surface. For example, a step-shaped interface S is formed between the ends surfaces of the first conductive post 22 and the second conductive post 24.

In an embodiment, the insulating portion 2a, 2a', 4a is made of a dielectric material. In another embodiment, the dielectric material is an organic dielectric material without glass fiber (for example, a solder mask material) or an inorganic dielectric material without glass fiber (for example, an insulating oxide). In yet another embodiment, the organic dielectric material can further contain a molding compound, an epoxy molding compound (EMC) or a primer.

In an embodiment, the circuit portion 2c, 2c', 4c, 4c' is a single-layer circuit (for example, the first circuit layer 250 and the second circuit layer 260 or aspects of FIGS. 4D and 4D') or a redistribution layer (for example, the first circuit structure 35, the second circuit structure 36 or aspects of FIGS. 4E and 4E').

In an embodiment, the conductive portions 2b, 4b are directly (as shown in FIGS. 2F, 2F-1, 3G, 4D and 4E) or indirectly (as shown in FIGS. 2F', 2F-2,3G', 4D' and 4E') electrically connected to the circuit portion 2c, 2c', 4c, 4c'.

The core layer structure 2, 2', 2" according to the present disclosure facilitates to increase the number of the electrical connection points per unit area and meet the requirements of fine-pitch and high-density circuits. In particular, it has following advantages.

First, the number of the electrical connection points per unit area is effectively increased. In particular, although the total thickness of the core layer structure 2, 2', 2" is increased, each sub-layer of the insulating portion 2a, 2a', 4a (for example, the first insulating layer 21, the second insulating layer 23 or insulating sections corresponding to the conductive posts) has a small thickness, and hence the size of the end surfaces of the conductive posts of each sub-layer can be minimized Therefore, the conductive portions 2b, 4b of the core layer structure 2, 2', 2" can be formed with fine pitch, thereby effectively increasing the electrical connection points per unit area.

Second, fine-pitch and high-density circuits are obtained. In particular, although the total thickness of the core layer structure 2, 2', 2" is increased, each sub-layer of the insulating portion 2a, 2a', 4a (for example, the first insulating layer 21, the second insulating layer 23 or insulating sections corresponding to the conductive posts) has a small thickness, and hence the size of the end surfaces of the conductive posts of each sub-layer can be minimized Therefore, the conductive portions 2b, 4b of the core layer structure 2, 2', 2" can be formed with fine pitch, thereby effectively reducing the surface area of the insulating portion 2a, 2a', 4a occupied by the end surfaces of the conductive posts and increasing the layout area of the circuit layers. As such, the present disclosure reduces limitations on circuit layout and is capable of fabricating fine-pitch and high-density circuits.

Third, the conductive portions 2b, 4b have a low fabrication cost. In particular, although the total thickness of the core layer structure 2, 2', 2" is increased, each sub-layer of the insulating portion 2a, 2a', 4a (for example, the first insulating layer 21, the second insulating layer 23 or insulating sections corresponding to the conductive posts) has a small thickness. As such, the openings in each sub-layer (such as the first and second through holes 210, 230 and the first and second openings 410, 430) can be easily and quickly formed. Further, good quality and high yield can be achieved no matter whether an electroplating process or a filling process is performed. Therefore, the fabrication cost is reduced.

Fourth, warping is effectively prevented from occurring during the packaging process. In particular, the increased thickness of the core layer structure 2, 2', 2" leads to good rigidity so as to meet the packaging requirement of highly integrated chips and prevent warping from occurring.

According to the present disclosure, even if the total thickness of the core layer structure is increased, the conductive portions with small-sized end surfaces can be readily fabricated according to the practical need. Therefore, the present disclosure not only prevents warping from occurring during the packaging process, but also has advantages of increasing the number of the electrical connection points per unit area, allowing fabrication of fine-pitch and high-density circuit layers and reducing the fabrication cost so as to meet the packaging requirement of highly integrated chips such as AI chips and ensure application stability.

The above-described descriptions of the detailed embodiments are only to illustrate the preferred implementation according to the present disclosure, and it is not to limit the scope of the present disclosure. Accordingly, all modifications and variations completed by those with ordinary skill in the art should fall within the scope of present disclosure defined by the appended claims

What is claimed is:

1. A method for fabricating a flip-chip packaging substrate, comprising:
    providing a carrier with a first insulating layer formed on the carrier;
    forming a plurality of first conductive posts in the first insulating layer;
    wherein two ends of the first conductive posts are free from being formed with pad structures;
    forming at least a second insulating layer on the first insulating layer, wherein the first insulating layer and the second insulating layer serve as an insulating portion;
    forming a plurality of second conductive posts in the second insulating layer in a manner that the second conductive posts are stacked on and in direct contact with the first conductive posts, wherein two ends of the second conductive posts are free from being formed with pad structures, wherein the second conductive posts and the first conductive posts serve as conductive portions, wherein the conductive portions are of a step-shaped pillar structure, and the insulating portion and the conductive portions serve as a core layer structure having opposite first and second surfaces, such that there are only the longitudinal conductive portions in the core layer structure and there are no other horizontal conductive circuits in the core layer structure;
    removing the carrier; and
    after removing the carrier, forming a circuit portion on the first and second surfaces of the core layer structure at the same or different times with the circuit portion electrically connected to the conductive portions,
    wherein the circuit portion is of a build-up type and includes circuit structures formed on the first and second surfaces of the core layer structure,
    wherein the circuit structures include a plurality of dielectric layers and a plurality of circuit layers bonded to the dielectric layers, and
    wherein the circuit layers have vertical portions and horizontal portions, the vertical portions of the circuit layers are directly and electrically connected to the first conductive posts and the second conductive posts, and the dielectric layers are spaced between the horizontal portions of the circuit layers and the corresponding first and second surfaces of the core layer structure.

2. The method of claim 1, wherein the insulating portion of the core layer structure is made of an organic dielectric material free of glass fiber or an inorganic dielectric material free of glass fiber.

3. The method of claim 1, wherein the circuit portion is a single-layer circuit.

* * * * *